US007787237B2

(12) United States Patent
Yamaguchi

(10) Patent No.: US 7,787,237 B2
(45) Date of Patent: Aug. 31, 2010

(54) DISPLAY PANEL STRUCTURE AND IMAGE FORMING APPARATUS HAVING THE SAME

(75) Inventor: Yasunaga Yamaguchi, Tokyo (JP)

(73) Assignee: Oki Data Corporation, Tokyo (JP)

( * ) Notice: Subject to any disclaimer, the term of this patent is extended or adjusted under 35 U.S.C. 154(b) by 1093 days.

(21) Appl. No.: 11/250,402

(22) Filed: Oct. 17, 2005

(65) Prior Publication Data

US 2006/0092036 A1 May 4, 2006

(30) Foreign Application Priority Data

Oct. 28, 2004 (JP) ............................. 2004-313501

(51) Int. Cl.
*H05K 5/00* (2006.01)
*H05K 7/00* (2006.01)
*H05K 1/14* (2006.01)
*G09G 5/00* (2006.01)
*G06F 3/38* (2006.01)

(52) U.S. Cl. .................. 361/679.01; 361/736; 361/742; 345/156; 345/204

(58) Field of Classification Search ................. 361/681, 361/736, 742, 679.01-49; 362/602; 345/156, 345/204
See application file for complete search history.

(56) References Cited

U.S. PATENT DOCUMENTS 3,692,997 A * 9/1972 Miller ........................ 362/602
4,528,617 A * 7/1985 Blackington ................ 362/558
6,005,775 A * 12/1999 Chiu .......................... 361/752
6,445,429 B1 * 9/2002 Moster et al. ................. 349/58
2004/0240193 A1 * 12/2004 Mertz et al. ................... 362/31

FOREIGN PATENT DOCUMENTS

JP 57-125548 U 8/1982
JP 61-042199 2/1986
JP 62-030188 U 2/1987
JP 63-114071 U 7/1988
JP 06-043812 2/1994
JP 10-161382 6/1998
JP 2004-111682 4/2004

* cited by examiner

*Primary Examiner*—Amr Awad
*Assistant Examiner*—Liliana Cerullo
(74) *Attorney, Agent, or Firm*—Kubotera & Associates LLC

(57) ABSTRACT

A display panel structure includes a circuit board, and a display unit substrate connected to the circuit board and having a display unit. The display panel structure further includes a supporting member comprised of a first supporting section that is fitted to the circuit board, a second supporting section that is fitted to the display unit substrate, and a spacer section to secure a specified space between the circuit board and the display unit substrate. With the supporting member, the display unit substrate is supported in a state inclined relative to the circuit board.

14 Claims, 13 Drawing Sheets

DISPLAY PANEL STRUCTURE AND IMAGE FORMING APPARATUS HAVING THE SAME

BACKGROUND OF THE INVENTION

1. Field of the Invention

The present invention relates to a display panel structure composed of a display substrate having a display unit and a circuit board. The present invention also relates to an image forming apparatus having the display panel structure.

2. Description of Related Art

An image forming apparatus, such as a printer, a copier, or facsimile equipment, has an operation panel for an operator to directly operate the image forming apparatus without a personal computer or a host device. In the operation panel, there are provided an operation unit substrate having an operation unit such as an operation button on a circuit board, and a display substrate having a display unit to display information related to an operation. The operation unit and the display unit are arranged such that they are exposed from an opening provided in a part of a housing of the image forming apparatus. An operation panel having such a constitution has been disclosed in, for example, Japanese Patent Publication No. 10-161382.

In an image forming apparatus, there are often limitations in a position for mounting the operation panel due to a device design or device size. For this reason, the display unit substrate and the operation unit substrate are preferably mounted in a small space.

To simplify the structure of the operation panel, it can be suggested to fabricate the display unit substrate and the operation unit substrate as a single substrate. In a display unit substrate for mounting a small component such as a liquid crystal display panel, it is usually necessary to provide a fine circuit layout. On the other hand, in an operation unit substrate for mounting a relatively large component such as an operation button, it is not necessary to provide a fine circuit layout. Accordingly, in order to fabricate the display unit substrate and the operation unit substrate as a single substrate, the substrate has to be fabricated according to specification of the display unit substrate that requires the fine circuit layout. In this case, while it is possible to reduce a size of the substrate, it is difficult to reduce manufacturing cost of the substrate itself.

In addition, when the display unit substrate and the operation unit substrate are fabricated as a single substrate, there is a limited space between the display unit substrate and the operation unit substrate, thereby making it difficult to mount a component between the substrates. Therefore, the substrate has to be made larger so as to be able to mount a component, thereby increasing the mounting space.

When the display unit substrate and the operation unit substrate are disposed separately, the following effects are expected. When the image forming apparatus are shipped to various countries where different language are used, it is necessary to adjust display control so as to be able to display information in the language used in the country. At this time, when the display unit substrate and the operation unit substrate are separately provided, it is easy to change the display unit substrate according to different specifications. Therefore, when the display unit substrate and the operation unit substrate are separately provided, the specification difference in the devices can be flexibly followed.

On the other hand, when the display unit substrate and the operation unit substrate are mounted to the image forming apparatus, those have to be mounted so that the display unit can be easily seen, i.e. the display unit has to be able to be visually checked, by an operator. For this reason, in a conventional image forming apparatus, the display unit substrate and the operation unit substrate are mounted in a state inclined relative to the image forming apparatus, so that an angle of the display unit is perpendicular to a direction of the operator's view.

When the display unit substrate and the operation unit substrate are mounted in a state inclined relative to the image forming apparatus, a space required for mounting the substrates increases, thereby increasing a size of the image forming apparatus.

In view of the problems described above, an object of the invention is to provide a display panel structure capable of reducing a size of an image forming apparatus, while an operator can easily see the display unit.

Further objects and advantages of the invention will be apparent from the following description of the invention.

SUMMARY OF THE INVENTION

In order to attain the objects described above, according to the present invention, a display panel structure includes a circuit board, and a display unit substrate connected to the circuit board and having a display unit. The display panel structure further comprises a support member having a first support section fitted to the circuit board, a second support section fitted to the display unit substrate, and a spacer section provided between the first and second support sections for securing a space between the circuit board and the display unit substrate. The display unit substrate is supported on the support member in a state inclined relative to the circuit board.

DESCRIPTION OF THE PREFERRED EMBODIMENTS

Hereunder, embodiments of the present invention will be explained with reference to the accompanying drawings.

First Embodiment

A first embodiment of the invention will be described with reference to the accompanying drawings. In the description below, a display panel of an electro-photographic printer is described as an example. First, a basic constitution of the electro-photographic printer is described below, referring to FIGS. 3-5.

Figure 5:
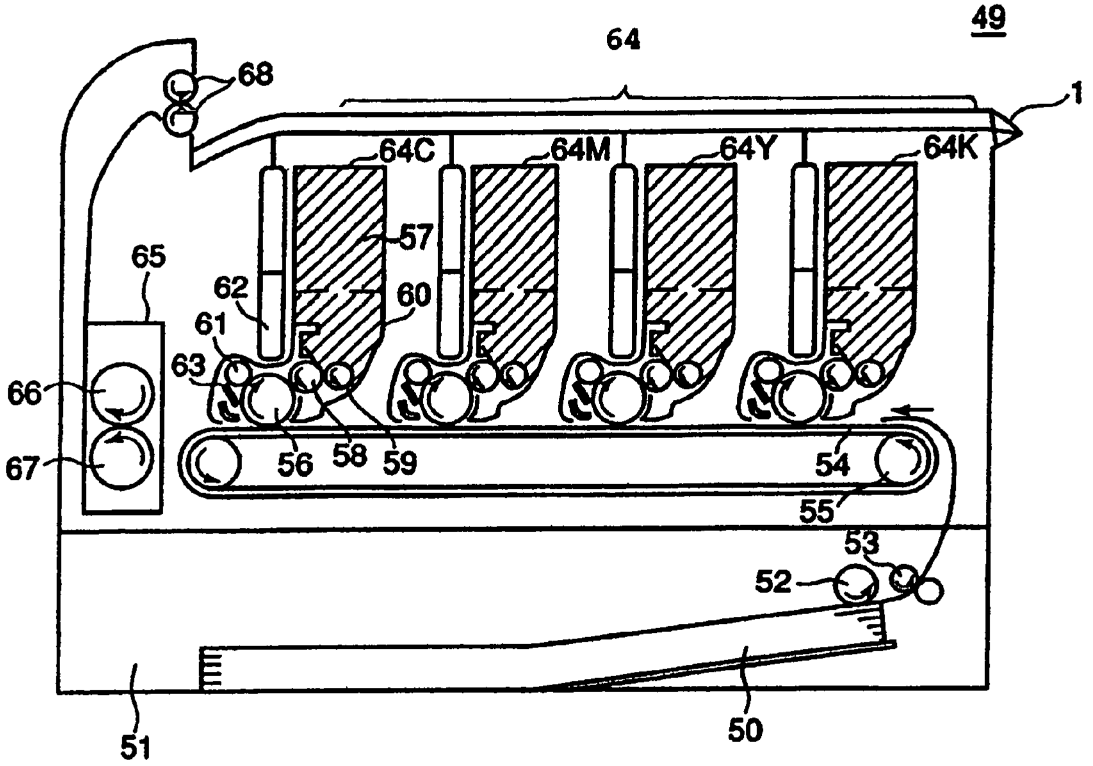
FIG. 5 is a schematic side view showing a constitution of the electro-photographic printer according to the invention.

As shown in FIG. 5, an electro-photographic printer 49 has a paper cassette 51 to store paper 50. A hopping roller 52 is rotatably provided above the paper cassette 51 for taking the paper 50 from the paper cassette 51. The paper 50 taken by the hopping roller 52 is conveyed by the paper-feeding roller 53 toward the image forming unit (described later).

A transferring belt 54 is provided above the paper cassette 51, so as to be rotatable with the driving roller 55. Four image drum units (ID units) 64 (64K, 64Y, 64M, 64C) are provided above the transferring belt 54 as the image forming units. Each ID unit 64 has an identical structure; therefore, in the description of the inner structure below, an inner structure of the ID unit 64C of cyan is described as an example.

In the ID unit 64C, there are a photosensitive drum 56 for forming an electrostatic latent image on a surface thereof; a developing unit 60 for forming a visible image with toner on the surface of the photosensitive drum 56; a charged roller 61 for charging the photosensitive drum 56; an LED array for forming an electrostatic latent image through exposing the photosensitive drum 56; and a cleaning blade 63 for removing the toner-remained on the surface of the photosensitive drum 56.

The developing unit 60 has a toner cartridge 57 for holding toner; a developing roller 58 contacting with the photosensitive drum 56; and a toner-supplying roller 59 for supplying toner to the developing roller 58. At a downstream side of the ID unit 64 in the paper conveyance direction, there is a fixing unit 65. The fixing unit 65 has a fixing roller 66 for heating the paper 50 on which toner is adhered, and a pressure roller 67 for pressing the paper 50 against the fixing roller 66. A paper-ejection roller 68 is provided above the fixing roller 65 for ejecting the paper 50.

Figure 3:
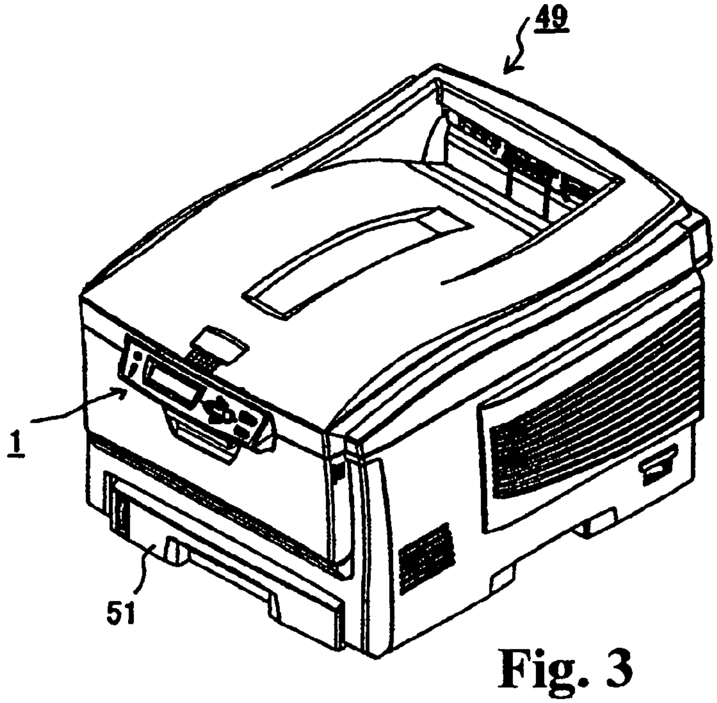
FIG. 3 is a perspective view of the outer appearance of an electro-photographic printer according to the invention.
Figure 4:
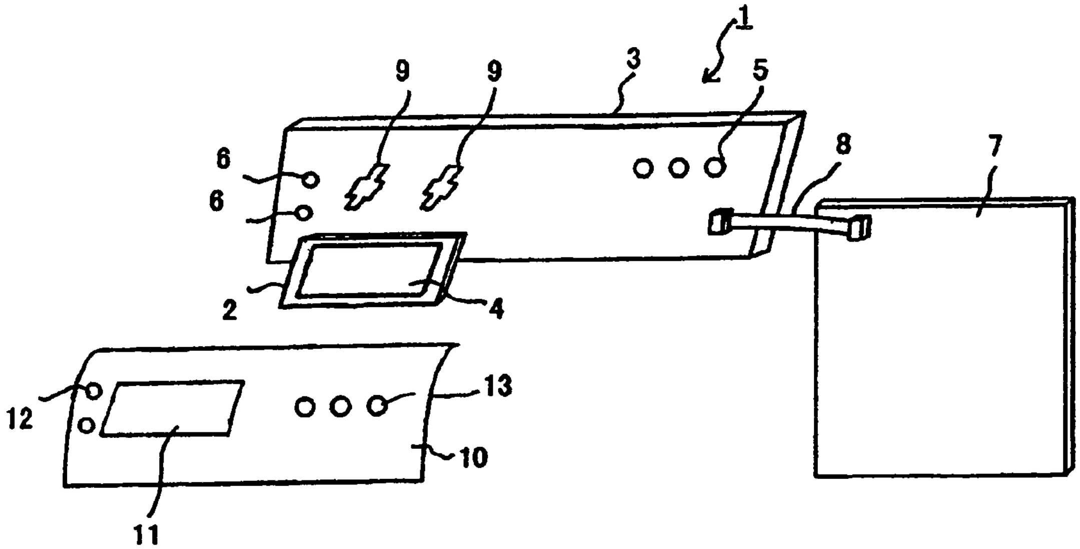
FIG. 4 shows the constitution of a display unit substrate and an operation unit substrate according to the invention.

As shown in FIGS. 3 and 4, an operation panel 1 that can be operated by the operator is provided at an upper portion on a front side of the electro-photographic printer. In the operation panel, a display unit substrate 2 having a liquid crystal display unit 4, and an operation unit substrate having operation buttons 5 and LEDs 6 on the circuit board are provided. In addition, a control substrate 7 is provided in a specified place in the electro-photographic printer 49 for controlling the operation panel 1. The control substrate 7 and the operation unit substrate 3 are connected via a cable 8. The display unit substrate 2 and the operation unit substrate 3 are connected through superimposing with connection terminals 9 (described later). An operation panel cover 10 is provided at the outside of the display unit substrate 2 and the operation unit substrate 3. The operation panel cover 10 has a display window 11 to make the liquid crystal display unit 4 visible from outside; LED windows 12 for making the LEDs 6 visible from outside; and an operation section 13 to enable the operator to operate the operation buttons 5 from outside.

Referring now to FIG. 5, a printing operation of the electro-photographic printer will be described below. Once the printing operation is started, the paper 50 stored in the paper cassette 51 is fed one by one from the uppermost one by the hopping roller 52, and sent to the ID unit 64 by the paper-supplying roller 53. The paper 50 is conveyed by the transferring belt 54, and passes below the ID unit 64K of black, ID unit 64Y of yellow, ID unit 64M of magenta, and ID unit 64C of cyan, in this order.

At each ID unit 64, according to the image data transmitted form the host device, such as a personal computer connected to network or the like, the electrostatic latent image is formed on the surface of the photosensitive drum 56 by the LED array 62. In the developing unit 60, toner is supplied to the photosensitive drum 56 by the toner-supplying drum 59 and the developing roller 58, and the electrostatic latent image is developed, so that the toner image is formed on the surface of the photosensitive drum 56. The toner image is transferred on the surface of the paper 50 conveyed on the transferring belt 54. The paper 50, to which each color of the toner image is transferred at each ID unit 64, is then conveyed to the fixing unit 65.

The fixing unit 65 has a fixing roller 66 having a heat source, and a pressure roller 67 contacting with the fixing roller 66 by pressure. The paper 50 conveyed to the fixing unit 65 is pressured and heated between the fixing roller 66 and the pressure roller 67, and the toner image on the surface of the paper 50 is melted and fixed thereon. The paper 50, on which the toner image is fixed, is then further conveyed, and ejected outside of the electro-photographic printer 49 by the paper-ejecting roller 68.

The above-described printing operation of the electro-photographic printer can be operated by a printer driver or the like, which is installed in the host device, such as a personal computer connected to the electro-photographic printer 49, and may be operated with the operation panel 1 (FIG. 3) provided on the electro-photographic printer 49. In this case, by operating the operation buttons 5 (FIG. 4) provided on the operation unit substrate 3, the electro-photographic printer 49 is operated. The content of the operation is displayed on the liquid crystal display unit 4 (FIG. 4) of the display unit substrate 2, and the operation is performed while the operator confirms the information displayed on the liquid crystal display unit 4. The content of the operation done by the operator is transmitted to the control board 7 (FIG. 4) connected to the operation unit substrate 3.

Figure 1:
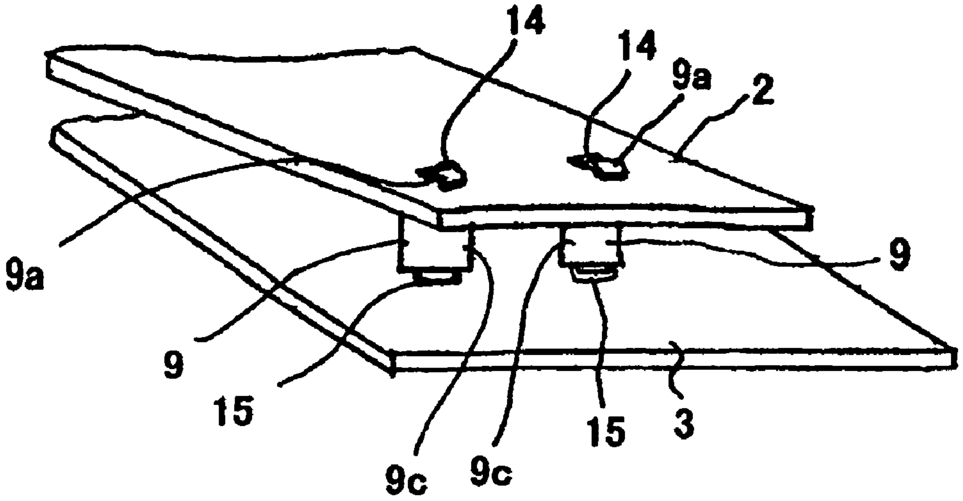
FIG. 1 is a perspective view of a display panel structure according to a first embodiment of the invention.
Figure 2:
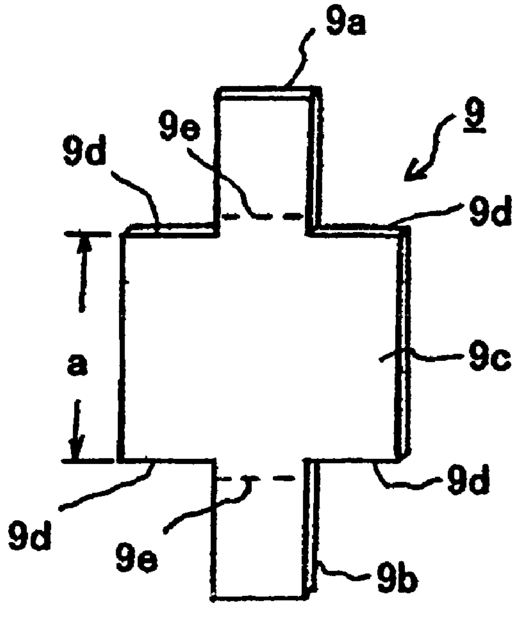
FIG. 2 is a perspective view of a connection terminal according to the first embodiment of the invention.

A constitution of the display panel and the connection terminal in the first embodiment will be described next. As shown in FIGS. 1 and 2, the connection terminals 9 are formed from a sheet of metallic material as a supporting member or supporting portion. Each connection terminal 9 has a spacer section 9*c*, and a pair of substrate supporting sections 9*a* and 9*b* provided at ends of the spacer section 9*c*. Folding sections 9*e* are formed at base sections of the substrate supporting sections 9*a* and 9*b*. The edges 9*d* of each spacer section 9*c*, where the substrate supporting sections 9*a* and 9*b* are formed, are where the spacer section 9*c* contacts with the display unit substrate 2 and the operation unit substrate 3. According to a length a of the spacer section 9*c*, a distance between the display unit substrate 2 and the operation unit substrate 3 is defined. Accordingly, by changing the length a of each spacer section 9*c*, the distance between the display unit substrate 2 and the operation unit substrate 3 can be easily changed.

A connection hole 14 is formed in the display unit substrate 2 for attaching the connection terminal 9, and a connection hole 15 is formed in the operation unit substrate 3 for attaching the connection terminal 9. The connection terminal 9 is preferably made from a metallic material, and the spacer section 9*c* may be made from an insulating material such as a plastic. The substrate supporting sections 9*a* and 9*b* may be made from a conductive material such as a metal. A shape of the connection terminal 9 is preferably flat, and the substrate supporting sections 9*a* and 9*b* may be formed in a cylindrical shape, and a spacer section 9*c* may be formed in a rectangular parallelepiped shape.

Figure 6:
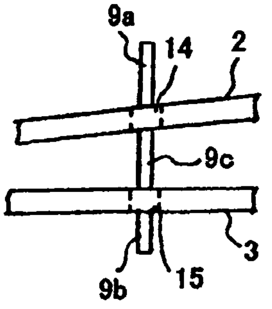
FIG. 6 is an explanatory side view (1) illustrating a process of attaching the connection terminal in the first embodiment of the invention.
Figure 7:
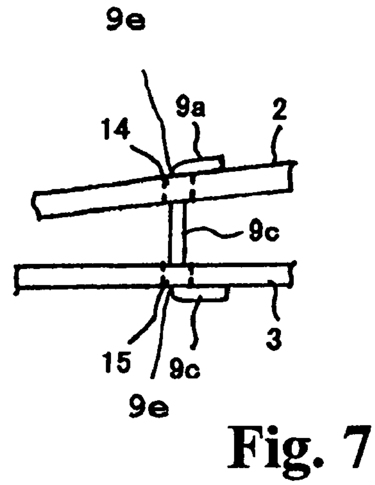
FIG. 7 is an explanatory side view (2) illustrating the process of attaching the connection terminal in the first embodiment of the invention.
Figure 8:
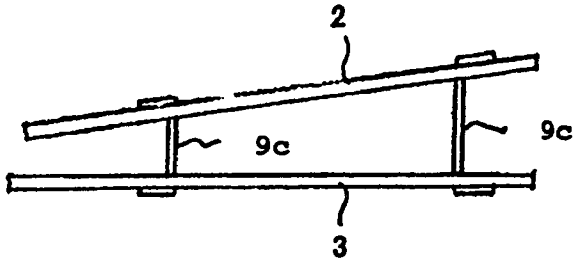
FIG. 8 is an explanatory side view (3) illustrating the process of attaching the connection terminal in the first embodiment of the invention.

A procedure of attaching the connection terminal in the first embodiment will be described below. FIGS. 6-8 are explanatory drawings, which illustrate how to attach the connection terminals in the first embodiment of the invention.

In the first embodiment, the display unit substrate 2 is attached with the connection terminals 9 being tilted relative to the operation unit substrate 3. First, according to the specification, such as an angle and distance between the display unit substrate 2 and the operation unit substrate 3 and an attaching position of each connection terminal 9, the length of the spacer section 9*c* of each connection terminal 9 is set. Then, as shown in FIG. 6, the substrate supporting section 9*a* of the connection terminal 9 and the substrate supporting section 9*b* of the connection terminal 9 are inserted in the connection holes 14 and 15, respectively. At this time, the substrate supporting sections 9*a* and 9*b* are inserted till the respective edges 9*d* contact with the display unit substrate 2 and the operation unit substrate 3.

Then, the substrate supporting sections 9*a* and 9*b* are bent at the bending sections 9*e* as shown in FIG. 7, so that the connection terminal 9 is tentatively secured to the display unit substrate 2 and the operation unit substrate 3. At this time, as shown in FIG. 8, by using the connection terminal 9 having a long spacer section 9*c* and the connection terminal 9 having a short spacer section 9*c*, the display unit substrate 2 can be attached being tilted relative to the operation unit substrate 3.

Then, the substrate supporting sections 9*a* and 9*b* are soldered to the display unit substrate 2 and the operation unit substrate 3, respectively, so that the connection terminals 9, the display unit substrate 2, and the operation unit substrate 3 are connected and secured. Accordingly, the display unit substrate 2 and the operation unit substrate 3 are electrically connected to each other. Here, the connection terminals can be soldered without bending the substrate supporting sections 9*a* and 9*b*. It is preferred that the connection terminals are electrically connected to the display unit substrate 2 and the operation unit substrate 3 by soldering the connection terminals after bending the substrate supporting sections 9*a* and 9*b*.

Figure 9:
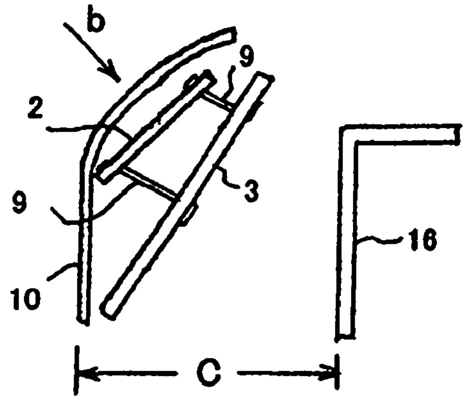
FIG. 9 is a side view showing the display unit substrate and the operation unit substrate in an attached state in the first embodiment of the invention.

FIG. 9 is an explanatory drawing, which illustrates the attachment of the display unit substrate and the operation unit substrate in the first embodiment of the invention. The display unit substrate 2 is attached being tilted relative to the operation unit substrate 3. The angle of the display unit substrate 2 to the operation unit substrate 3 is set such that the display unit substrate 2 is perpendicular to the viewing direction b of the operator. The angle of the operation unit substrate 3 is set more vertical than that of the display unit substrate 2. By attaching the operation unit substrate 3 almost perpendicularly, the distance c between a housing frame 16 and the operation panel cover 10 can be made shorter, so that the electro-photographic printer 49 (FIG. 3) can be miniaturized.

According to the first embodiment of the invention, the display unit substrate 2 is attached so as to be perpendicular to the viewing direction b of the operator, and simultaneously be tilted relative to the operation unit substrate 3, or almost vertical. With this constitution, visibility of the liquid crystal display unit 4 by the operator can be secured, and miniaturization of the image forming apparatus can be achieved. In addition, by forming each contact terminal 9 from a metal sheet, the cost to attach the display unit substrate 2 and the operation unit substrate 3 can be reduced.

Second Embodiment

Figure 10:
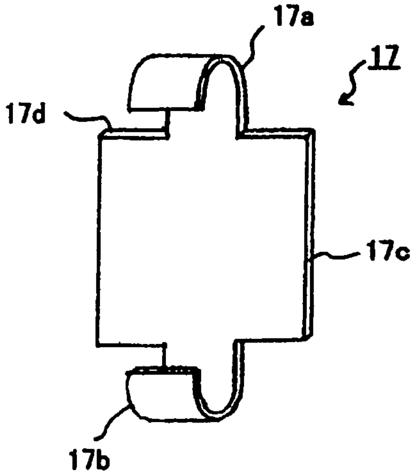
FIG. 10 is a perspective view of a contact terminal according to a second embodiment of the invention.

As shown in FIG. 10, similarly to the connection terminal 9 in the first embodiment, a connection terminal 17 in the second embodiment has a spacer section 17*c*, and a pair of substrate supporting sections 17*a* and 17*b*, which is provided at both edges of the spacer section 17*c*. While the substrate supporting sections 9*a* and 9*b* in the first embodiment are flat, the substrate supporting sections 17*a* and 17*b* in the second embodiment are bent into a curve. Other features of the second embodiment are similar to those of the connection terminals 9 of the first embodiment.

Figure 11:
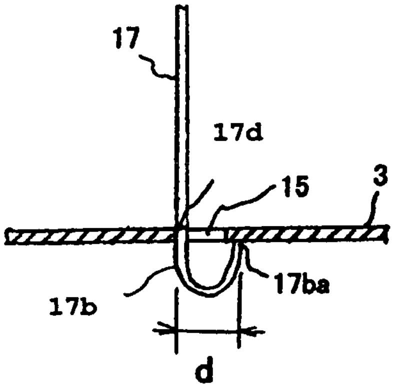
FIG. 11 is a side view showing the attachment of the connection terminal in the second embodiment of the invention.

As shown in FIG. 11, a distance between the edge 17*d* of the spacer section 17*c* and the edge 17*ba* of the substrate supporting section 17*b* is substantially same as a thickness of the operation unit substrate 3. In addition, a distance between the edge 17*d* and an end of the substrate supporting section 17*a*, which is not illustrated, is substantially same as a thickness of the display unit substrate 2. Furthermore, a width d of the curve of the substrate supporting section 17*b* is set slightly larger than a diameter of the connection hole 15 of the operation unit substrate 3. In addition, a width of the curve of the substrate supporting section 17*a*, which is not illustrated in the figure, is set slightly larger than a diameter of the connection hole 14 of the display unit substrate 2. Here, the width of the curves of the substrate supporting sections 17*a* and 17*b* are set such that the substrate supporting sections 17*a* and 17*b* can be inserted into the respective connection holes 14 and 15 through elastic deformation thereof.

Figure 12:
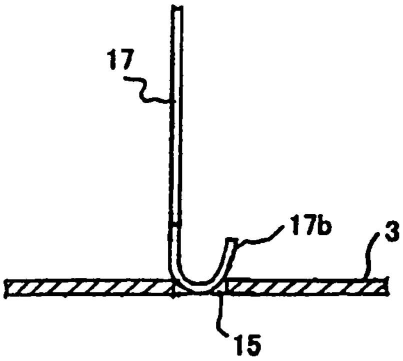
FIG. 12 is an explanatory side view (1) illustrating a process of attaching the connection terminal in the second embodiment of the invention.
Figure 13:
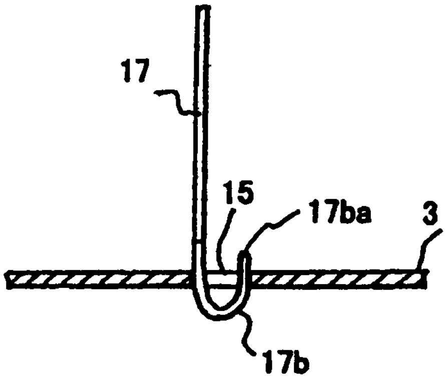
FIG. 13 is an explanatory side view (2) illustrating the process of attaching the connection terminal in the second embodiment of the invention.

Next, a procedure of attaching the connection terminal in the second embodiment will be described below. FIGS. 12 and 13 are explanatory drawings illustrating how to attach the connection terminal in the second embodiment of the invention. In the second embodiment, similarly to the first embodiment, the display unit substrate 2 is attached to the operation unit substrate 3 in a tilted state. The following description explains how to attach the connection terminal 17 to the operation unit substrate 3 as an example.

First, as shown in FIG. 12, the substrate supporting section 17*b* of the connection terminal 17 is positioned onto the connection hole 15 of the operation unit substrate 3. Then, the connection terminal 17 is pressed into the connection hole 15 from an upper side. By pressing the connection terminal 17 therein, as shown in FIG. 13, the substrate supporting section 17*b* enters the connection hole 15 while being elastically deformed. When the end 17*ba* of the substrate supporting section 17*b* passes through the connection hole 15, the end portion 17*ba* of the substrate supporting section 17*b*, which is elastically deformed, returns to the original position, and the end portion 17*ba* contacts with a lower surface of the operation unit substrate 3 as shown in FIG. 11. In addition, once the end portion 17*ba* passes through the connection hole 15, the edge 17*d* abuts against an upper surface of the operation unit substrate 3. Accordingly, the operation unit substrate 3 is caught between the end 17*ba* of the substrate supporting section 17*b* and the edge 17*d*, and the connection terminal 17 is tentatively secured to the operation unit substrate 3. Similarly, the connection terminal 17 is tentatively secured to the display unit substrate 2.

Then, similarly to the first embodiment, the substrate supporting sections 17*a* and 17*b* are respectively soldered to the display unit substrate 2 and the operation unit substrate 3, so that the connection terminals 17, the display unit substrate 2, and the operation unit substrate 3 are connected and secured. Accordingly, the display unit substrate 2 and the operation unit substrate 3 are electrically connected.

According to the second embodiment of the invention, the substrate supporting sections 17*a* and 17*b* of the connection terminal 17 are respectively bent into a curved shape in advance. Accordingly, it is not necessary to bend the substrate supporting sections 17*a* and 17*b* after inserting in the respective connection holes 14 and 15, thereby making it easy to connect the connection terminal 17, the display unit substrate 2 and the operation unit substrate 3, in addition to the effects of the first embodiment. Furthermore, since the connection terminals 17 are secured to the display unit substrate 2 and the operation unit substrate 3 once the substrate supporting sections 17*a* and 17*b* are respectively inserted into the connection holes 14 and 15, the connection can be made precisely at the time of soldering the connection terminal 17 to the display unit substrate 2 and the operation unit substrate 3.

Third Embodiment

Figure 14:
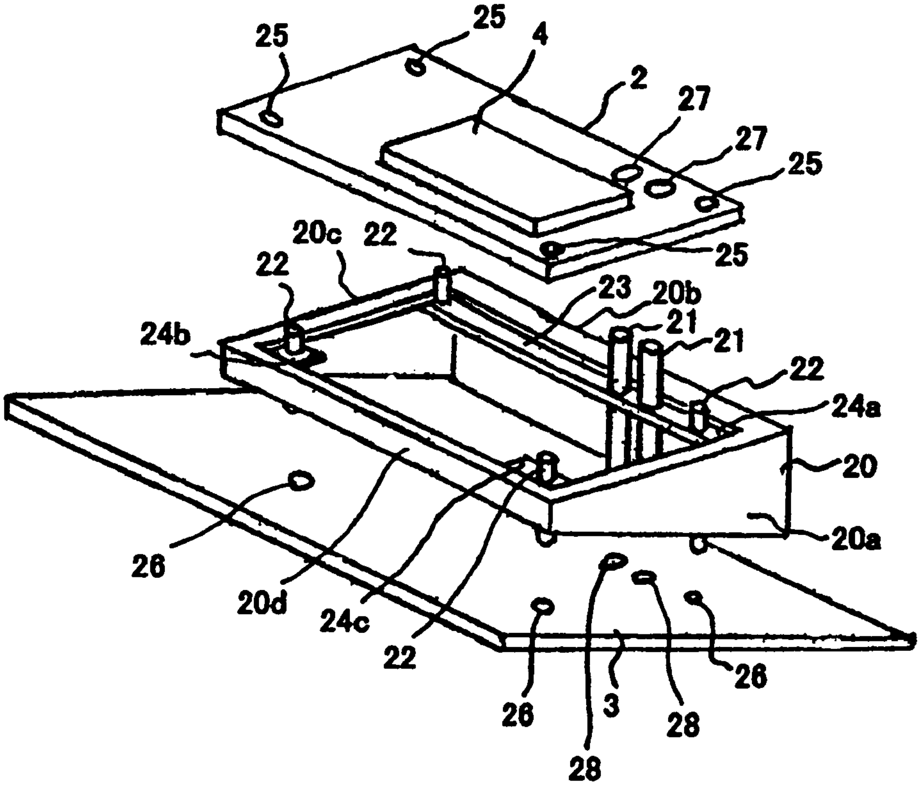
FIG. 14 is an exploded perspective view illustrating a spacer section in an attached state in a third embodiment of the invention.

As shown in FIG. 14, in the third embodiment, a spacer section 20, connection terminals 21, and substrate supporting sections 22 are provided as a supporting member. The spacer section 20 has four wall sections, 20*a*, 20*b*, 20*c*, and 20*d*, which respectively have rectangular shapes. In addition, the spacer section 20 has a substrate-attaching section 23 to be attached to the display unit substrate 2. The spacer section 20 is formed from an insulating material such as a plastic.

The substrate attaching section 23 has holding members 24*a*, 24*b*, and 24*c*, which respectively have the substrate supporting sections 22. The display unit substrate 2 is placed on the holding members 24*a*, 24*b*, and 24*c*, and a position of the display unit substrate 2 is maintained by the substrate supporting section 22. Each substrate supporting section 22 is designed to enter a connection hole 25 formed in the display unit substrate 2. In addition, each substrate supporting section 22 protrudes downwardly relative to the spacer section 20, and is designed to enter a connection hole 26 formed in the operation unit substrate 3.

The holding member 24*a* has the connection terminals 21. The connection terminals 21 protrude upwardly and downwardly relative to the spacer section 20. Upper ends of the connection terminals 21 enter the connection holes 27 formed in the display unit substrate 2, and lower ends thereof enter the connection holes 28 formed in the operation unit substrate 3. With the connection terminals 21, the display unit substrate 2 and the operation unit substrate 3 are electrically connected to each other. The spacer section 20 has a hollow portion surrounded by the wall sections 20*a*, 20*b*, 20*c*, and 20*d*, so that components are mounted therein. The wall sections 20*a* and 20*c* of the spacer section 20 respectively have long sides and short sides, and a height between the sides gradually changes, i.e., an inclined rectangular shape. The wall section 20*b* has a height larger than that of the wall section 20*d*. Because of the shapes of the wall sections 20*a*, 20*b*, 20*c*, and 20*d*, the display unit substrate 2 can be attached to the operation unit substrate 3 in a tilted state.

Next, a procedure of attaching the spacer section in the third embodiment will be described below. First, the substrate supporting sections 22 of the spacer section 20 are inserted into the connection holes 25, and the display unit substrate 2 is attached to the substrate attaching section 23 of the spacer section 20. At this time, the upper ends of the connection terminals 21 of the spacer section 20 are also inserted into the connection holes 27 of the display unit substrate 2 and soldered thereto. Accordingly, the display unit substrate 2 and the connection terminal 21 are electrically connected to each other.

Then, the substrate supporting sections 22 protruding downwardly relative to the spacer section 20 are inserted into the connection holes 26 of the operation unit substrate 3, so that the spacer section 20 is attached to the operation unit substrate 3. At this time, the lower ends of the connection terminals 21 of the spacer section 20 are also inserted in the connection holes 28, and soldered thereto. Accordingly, the operation unit substrate 3 and the connection terminal 21 are electrically connected, and the display unit substrate 2 and the operation unit substrate 3 are electrically connected via the connection terminals 21.

According to the third embodiment of the invention, the spacer section 20 is formed to surround the four sides of the portion to which the display unit substrate 2 is attached, and the display unit substrate 2 is secured by the substrate supporting sections 22. Accordingly, the display unit substrate 2 can be attached to the operation unit substrate 3 in a tilted state. Further, the display unit substrate 2 can be stably attached to the operation unit substrate 3. In addition, by changing the shapes (heights) of the wall sections 20*a*, 20*b*, 20*c* and 20*d* of the spacer section 20, the angle and the distance of the display unit substrate 2 relative to the operation unit substrate 3 can be easily changed. Furthermore, since the display unit substrate 2 and the operation unit substrate 3 are connected by one spacer section, assembling work can be simplified.

Fourth Embodiment

Figure 15:
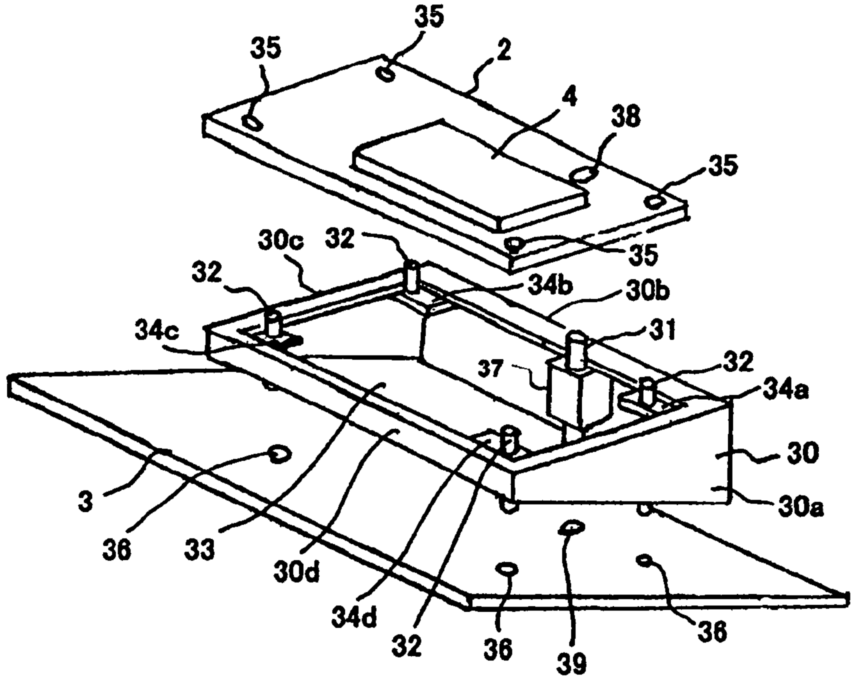
FIG. 15 is an exploded perspective view illustrating a spacer section in an attached state in a fourth embodiment of the invention.

As shown in FIG. 15, in the fourth embodiment, a spacer section 30, a connection terminal 31, and substrate supporting sections 32 are provided as a supporting member. The spacer section 30 has four wall sections 30*a*, 30*b*, 30*c*, and 30*d*, which have respectively rectangular shapes. In addition, with the four wall sections 30*a*, 30*b*, 30*c*, and 30*d*, a substrate attaching section 33, to which the display unit substrate 2 is attached, is formed. The spacer section 30, the connection terminal 31, and the substrate supporting sections 32 are made from a metallic material.

The substrate attaching section 33 has holding members 34*a*, 34*b*, 34*c*, and 34*d*, which respectively have substrate supporting sections 32. The display unit substrate 2 is placed on the holding members 34*a*, 34*b*, 34*c*, and 34*d*, and a position thereof is maintained by the substrate supporting sections 32. Each substrate supporting section 32 is designed to enter a connection hole 35, which is formed in the display unit substrate 2. In addition, each substrate supporting section 32 also protrudes downwardly relative to the spacer section 30, and enters a connection hole 36, which is formed in the operation unit substrate 3.

The spacer section 30 has a terminal supporting section 37 at the inner side of the wall section 30*b*. The connection terminal 31 is attached to the terminal supporting section 37, so as to protrude upwardly and downwardly relative to the terminal supporting section 37. An upper end of the connection terminal 31 enters a connection hole 38 formed in the display unit substrate 2, while a lower end of the connection terminal 31 enters a connection hole 39 formed in the operation unit substrate 3. With the connection terminal 31, the display unit substrate 2 and the operation unit substrate 3 are electrically connected to each other.

The spacer section 30 has a hollow portion surrounded by the wall sections 30*a*, 30*b*, 30*c*, and 30*d*, so that components can be mounted therein. The wall sections 30*a* and 30*c* have lower edges and higher edges with a height gradually changing between the edges, i.e., an inclined shape. The wall section 30*b* has a constant higher height, and the wall section 30*d* has a constant lower height. Because of the shapes of the wall sections 30*a*, 30*b*, 30*c*, and 30*d*, the display unit substrate 2 can be attached to the operation unit substrate 3 in a tilted state.

In this embodiment, the spacer section 30 is made from a metallic material, and therefore, it has sufficient heat resistance against a melting point of solder. Accordingly, regardless of a shape and size of the substrate supporting sections 32, the spacer section 30 can be stably connected to the display unit substrate 2 and the operation unit substrate 3 with solder. The connection terminal 31 is used as a signal terminal for the display unit substrate 2 and the operation unit substrate 3. Also, the substrate supporting sections 32 are used as a ground terminal for the display unit substrate 2 and the operation unit substrate 3. While two connection terminals 21 are respectively provided as a signal terminal and ground terminal in the third embodiment (FIG. 14), a connection terminal for ground is not required in this embodiment because the spacer section 30 and the substrate supporting section 32 are made from a metallic material.

Next, a procedure of attaching the spacer section in the fourth embodiment will be described below. First, by inserting the substrate supporting sections 32 of the spacer section 30 into the connection holes 35 of the display unit substrate 2, the display unit substrate 2 is attached to the substrate attaching section 33 on the spacer section 30. At this time, the upper end of the connection terminal 31 of the spacer section 30 is also inserted into the connection hole 38 of the display unit substrate 2 and soldered thereto. Accordingly, the display unit substrate 2 and the connection terminal 31 are electrically connected to each other.

Next, before mounting the spacer section 30 with the display unit substrate 2 is mounted thereon on the operation substrate 3, necessary electronic components are mounted on the operation unit substrate 3. Then, by inserting the substrate supporting sections 32 protruding downwardly relative to the spacer section 30 into the connection holes 36 of the operation unit substrate 3, the spacer section 30 is attached to the operation unit substrate 3. Simultaneously, the lower end of the connection terminal 31 of the spacer section 30 is inserted into the connection hole 39, and soldered. Accordingly, the operation unit substrate 3 and the connection terminal 31 are electrically connected to each other, and the display unit substrate 2 and the operation unit substrate 3 are electrically connected via the connection terminal 31.

According to the fourth embodiment, the spacer section 30 and the substrate supporting section 32 are made from a metallic material. Therefore, they have sufficient heat resistance against a melting point of solder, so that there is another benefit that the spacer section 30 can be stably connected to the display unit substrate 2 and the operation unit substrate 3 with solder, in addition to the effects in the third embodiment. In addition, since the substrate supporting sections 32 can be used as the connection terminals for ground, a connection terminal for ground does not have to be additionally provided. Furthermore, a plurality of the substrate supporting sections 32 is provided on the spacer section 30, thereby improving grounding effect and anti-noise properties.

Fifth Embodiment

Figure 16:
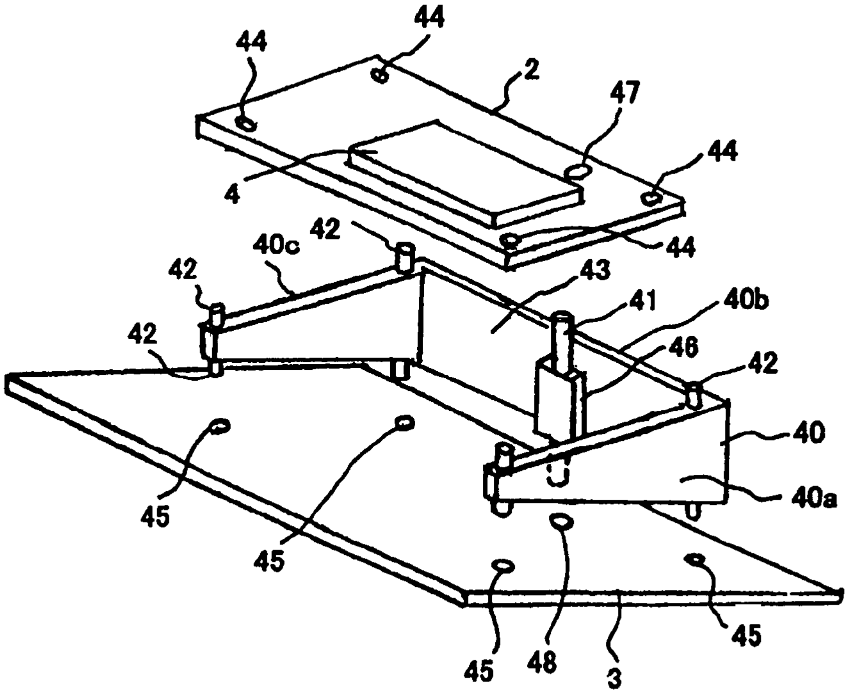
FIG. 16 is an exploded perspective view illustrating a spacer section in an attached state in a fifth embodiment of the invention.

As shown in FIG. 16, in the fifth embodiment, a spacer section 40, a connection terminal 41, and substrate supporting sections 42 are provided as a supporting member. The spacer section 40 has three wall sections 40*a*, 40*b*, and 40*c*. With the three wall sections 40*a*, 40*b*, and 40*c*, a substrate attaching section 43 is formed for attaching the display unit substrate 2. The spacer section 40, the connection terminal 41, and the substrate supporting sections 42 are made from a metallic material.

Connection holes 44 are formed in the display unit substrate 2 at positions corresponding to the substrate supporting sections 42. Also, connection holes 45 are formed in the operation unit substrate 3 at positions corresponding to the substrate supporting sections 42. By inserting the substrate section 42 into the holes 44 and 45, the spacer section 40 is secured to the display unit substrate 2 and the operation unit substrate 3.

A terminal supporting section 46 is formed at the inner side of the wall section 40*b* of the spacer section 40. A connection terminal 41 is attached to the terminal supporting section 46 so as to protrude upwardly and downwardly relative to the terminal supporting section 46. An upper end of the connection terminal 41 is inserted into a connection hole 47 formed in the display unit substrate 2, and a lower end of the connection terminal 41 is inserted into a connection hole 48 formed in the operation unit substrate 3. With the connection terminal 41, the display unit substrate 2 and the operation unit substrate 3 are electrically connected to each other.

Components can be mounted in an area surrounded by the three wall sections 40_a_, 40_b_, and 40_c_ of the spacer section 40. The wall sections 40_a_ and 40_c_ have lower edges and higher edges with a height gradually changing between the edges, i.e., an inclined shape. The wall section 40_b_ of the spacer section 40 has a constant higher height. Because of the shapes of the wall sections 40_a_, 40_b_, and 40_c_, the display unit substrate 2 can be attached to the operation unit substrate 3 in a tilted state.

Figure 17:
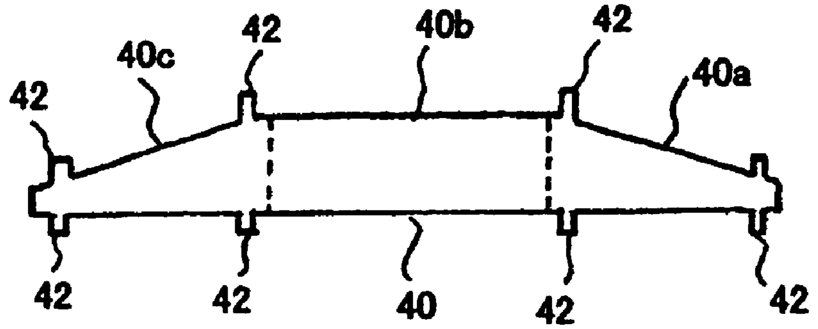
FIG. 17 is an unfolded view of the spacer section in the fifth embodiment of the invention.

In the embodiment, as shown in FIG. 17, the spacer section 40 is formed through bending a metal sheet (bending along a hidden line in the figure). By forming the spacer section 40 bending a metal sheet, the spacer section 40 can be easily manufactured at lower cost. In addition, since it is easy to change the shape of the spacer section 40, the angle of the display unit substrate 2 to the operation unit substrate 3 can be easily changed. Furthermore, by forming the spacer section 40 and the substrate supporting section 42 as a one-piece component from a metallic material, the substrate supporting section 42 can be used as a connection terminal for grounding.

Next, a procedure of attaching the spacer section 40 in the fifth embodiment will be described below. First, the spacer section 40 is formed through bending a metal sheet having a shape illustrated in FIG. 17 at the hidden line. Then, the substrate supporting sections 42 of the spacer section 40 are inserted into the connection hole 44 of the display unit substrate 2, and the ends of the substrate supporting sections 42 protruding upwardly from the connection holes 44 are bent, so that the spacer section 40 is secured. At this time, the upper end of the connection terminal 41 of the spacer section 40 is inserted into the connection hole 47 of the display unit substrate 2, and soldered. Accordingly, the display unit substrate 2 and the connection terminal 41 are electrically connected to each other.

Next, the substrate supporting sections 42 protruding downwardly relative to the spacer section 40 are inserted into the connection holes 45 of the operation unit substrate 3, and the ends of the substrate supporting sections 42 protruding downwardly from the connection hole are bent so as to secure the spacer section 40. At this time, the lower end of the connection terminal 41 of the spacer section 40 is inserted into the connection hole 48 of the operation unit substrate 3, and soldered. Accordingly, the display unit substrate 2 and the operation unit substrate 3 are electrically connected to each other.

Figure 18:
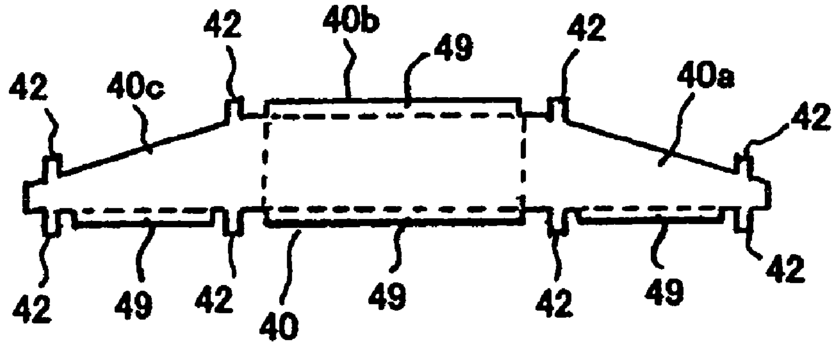
FIG. 18 is a plan view showing a modification of the spacer section of the fifth embodiment of the invention.

FIG. 18 is an unfolded view illustrating a modified example of the spacer section of the fifth embodiment. In this modified example, parts of the spacer section 40, e.g. the upper and the lower sides of the wall section 40_b_, the lower side of the wall section 40_a_, and the lower side of the wall section 40_c_ have reinforcing sections 49. By providing the reinforcing sections 49, the strength of the spacer section 40 can be improved.

According to the fifth embodiment of the invention, the spacer section 40 is formed from a metal sheet. Accordingly, in addition to the effects of the fourth embodiment, there is a benefit that the spacer section 40 can be easily manufactured at low cost. Also, since the shape of the spacer section 40 can be easily changed, the angle of the display unit substrate 2 to the operation unit substrate 3 can be easily changed. Furthermore, the side facing the wall section 40_b_ of the spacer section 40 is open, thereby improving heat radiation effect.

Sixth Embodiment

Figure 19:
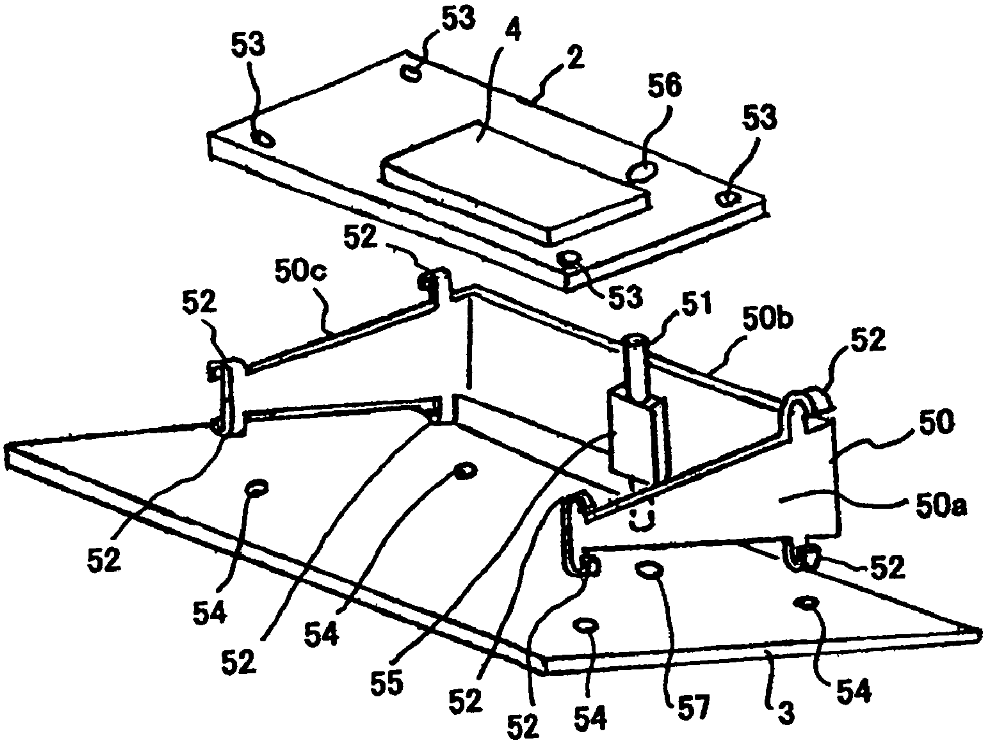
FIG. 19 is an exploded perspective view illustrating a spacer section in an attached state in a sixth embodiment of the invention.
Figure 20:
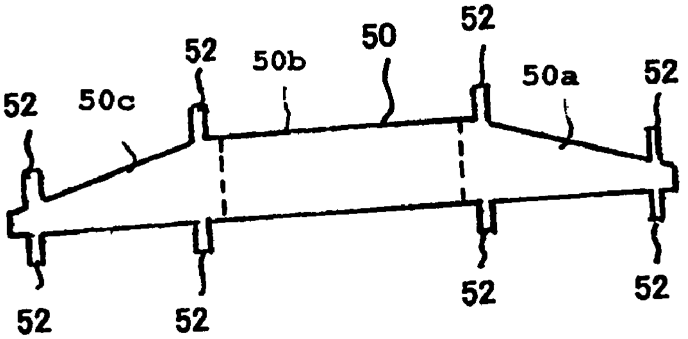
FIG. 20 is an unfolded view of the spacer section in the sixth embodiment of the invention.

As shown in FIGS. 19 and 20, in the sixth embodiment, a spacer section 50 has substrate supporting sections 52 having a shape modified from that of the substrate supporting sections 42 of the spacer section 40 in the fifth embodiment. More specifically, in the sixth embodiment, upper and lower ends of the substrate supporting sections 52 of the spacer section 50 are respectively bent into a curve like the connection terminals 17 in the second embodiment. Other structural features of the embodiment are similar to those of the spacer section 40 in the fifth embodiment.

As shown in FIG. 19, the spacer section 50, a connection terminal 51, and the substrate supporting sections 52 are provided as a supporting member. The spacer section 50 has three wall sections 50_a_, 50_b_, and 50_c_. The upper and the lower ends of the substrate supporting sections 52 are bent into a curved shape. The bent end of the substrate supporting section 52 is positioned at a position higher or lower than the wall sections 50_a_ and 50_c_ by thicknesses of the display unit substrate 2 and the operation unit substrate 3. The spacer section 50, the connection terminal 51, and the substrate supporting sections 52 are formed from a metallic material.

The display unit substrate 2 has connection holes 53 at positions corresponding to the substrate supporting sections 52. The operation unit substrate 3 has connection holes 54 at positions corresponding to the substrate supporting sections 52. By inserting the substrate supporting sections into the connection holes 53 and 54, the spacer section 50 is secured to the display unit substrate 2 and the operation unit substrate 3.

The spacer section 50 has a terminal supporting section 55 on the inner side of the wall section 50_b_. The connection terminal 51 is attached to the terminal supporting section 55 so as to protrude upwardly and downwardly relative to the terminal supporting section 55. An upper end of the connection terminal 51 enters a connection hole 56 formed in the display unit substrate 2, while a lower end of the connection terminal 51 enters a connection hole 57 formed in the operation unit substrate 3. With the connection terminal 51, the display unit substrate 2 and the operation unit substrate 3 are electrically connected to each other.

Next, a procedure of attaching the spacer section in the sixth embodiment will be described below. First, the spacer section 50 is formed through bending a metal sheet having the shape illustrated in FIG. 20 at hidden lines. At this time, the upper and the lower ends of the substrate supporting sections 52 are respectively bent into a curved shape. Then, the substrate supporting sections 52 of the spacer section 50 are inserted into the connection holes 53 of the display unit substrate 2. At this time, since the upper ends of the substrate supporting sections 52 are respectively bent into a curved shape, the substrate supporting sections 52 are elastically deformed and enter the connection holes 53. Once the substrate supporting sections 52 pass through the connection holes 53, the elastic deformation of the substrate supporting sections 52 is recovered. Accordingly, the display unit substrate 2 is tightly held with the wall sections 50_a_ and 50_c_ and the ends of the substrate supporting sections 52. Simultaneously, the upper end of the connection terminal 51 of the spacer section 50 is inserted into the connection hole 56 of the display unit substrate 2, and soldered. Accordingly, the display unit substrate 2 and the connection terminal 51 are electrically connect to each other.

Next, before mounting the spacer section 50, on which the display unit substrate 2 is mounted, on the operation unit substrate 3, necessary electronic components are mounted on the operation unit substrate 3. Then, the substrate supporting sections 52 protruding downwardly relative to the spacer section 50 is inserted into the connection hole 54 of the operation unit substrate 3. At this time, since the lower ends of the substrate supporting sections 52 are respectively bent into a curved shape, the substrate supporting sections 52 are elastically deformed and enter the connection holes 54. Once the substrate supporting sections 52 pass through the connection holes 54, the elastic deformation is recovered. Accordingly, the operation unit substrate 3 is tightly held withy the wall sections 50*a* and 50*c* and the ends of the substrate supporting sections 52. Simultaneously, the lower end of the connection terminal 51 of the spacer section 50 is inserted into the connection hole 57 of the operation unit substrate 3, and soldered. Accordingly, the operation unit substrate 3 and the connection terminal 51 are electrically connected to each other, and the display unit substrate 2 and the operation unit substrate 3 are electrically connected via the connection terminal 51.

Figure 21:
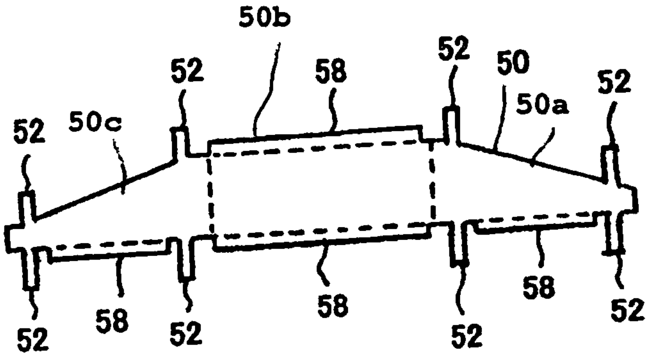
FIG. 21 is an unfolded view of a modification of the spacer section in the sixth embodiment of the invention.

FIG. 21 shows an unfolded view showing a modified example of the spacer section of the sixth embodiment of the invention. In this modified example, parts of the spacer section 50, e.g. upper and lower sides of the wall section 50*b*, a lower side of the wall section 50*a*, and a lower side of the wall section 50*c* respectively have reinforcing sections 58. With the reinforcing sections, the strength of the spacer section can be improved.

According to the sixth embodiment of the invention, the upper and the lower ends of the substrate supporting section 52 of the spacer section 50 have curved shapes. Accordingly, in addition to the effects of the fifth embodiment, there is a benefit that the connection among the spacer section 50, the display unit substrate 2, and the operation unit substrate 3 can be easily made. In addition, since the display unit substrate 2 and the operation unit substrate 3 are tightly held and secured by the substrate supporting sections 52, the connection can be made highly precisely in terms of dimension, at the time of attaching the spacer section 50 to the display unit substrate 2 and the operation unit substrate 3.

Seventh Embodiment

Figure 22:
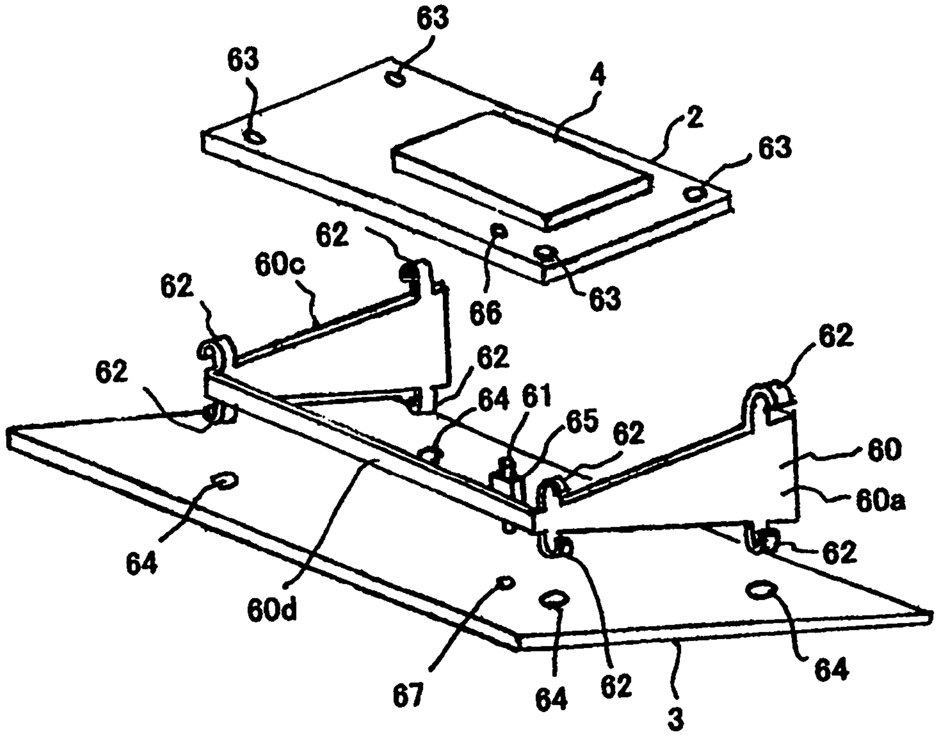
FIG. 22 is an exploded perspective view illustrating a spacer section in a mounted state in a seventh embodiment of the invention.

As shown in FIG. 22, in the seventh embodiment, a spacer section 60, a connection terminal 61, and substrate supporting sections 62 are provided as the supporting member. The spacer section 60 has three wall sections 60*a*, 60*c*, and 60*d*. The wall sections 60*a* and 60*c* of the spacer section 60 have lower edges and higher edges with a height gradually changing between the edges, i.e., an inclined shape. The wall section 60*d* of the spacer section 60 has a constant lower height. Because of the shapes of the wall sections 60*a*, 60*c* and 60*d*, the display unit substrate 2 can be attached to the operation unit substrate 3 in a tilted state.

Similarly to the sixth embodiment, upper and lower ends of the substrate supporting sections 62 are bent into a curved shape. The ends of the bent substrate supporting section 62 are positioned at a position higher or lower than the wall sections 60*a* and 60*c* by the thicknesses of the display unit substrate 2 and the operation unit substrate 3. The spacer section 60, the connection terminal 61, and the substrate supporting sections 62 are formed from a metallic material.

The display unit substrate 2 has connection holes 63 at positions corresponding to the substrate supporting sections 62. The operation unit substrate 3 has connection holes 64 at positions corresponding to the substrate supporting sections 62. By inserting the substrate supporting sections 62 into the connection holes 63 and 64, the spacer section 60 is secured to the display unit substrate 2 and the operation unit substrate 3.

The spacer section 60 has a terminal supporting section 65 on the inner side of the wall section 60*d*. The connection terminal 61 is attached to a terminal supporting section 65 protruding upwardly and downwardly relative to the terminal supporting section 65. An upper end of the connection terminal 61 enters the connection hole 66 formed in the display unit substrate 2, while a lower end of the connection terminal 61 enters the connection hole 67 formed in the operation unit substrate 3. With the connection terminal 61, the display unit substrate 2 and the operation unit substrate 3 are electrically connected to each other.

A procedure of attaching the spacer section in the seventh embodiment is similar to that in the sixth embodiment, and explanation thereof is omitted.

According to the seventh embodiment, the wall sections 60*a* and 60*c* of the spacer section 60, which respectively have an oblique side, is connected with the wall section 60*d* with a lower height. Accordingly, a size of the metal sheet to form the spacer section 60 can be reduced. In addition, since the side facing the wall section 60*d* is widely opened, large components can be efficiently mounted in the opening.

Eighth Embodiment

Figure 23:
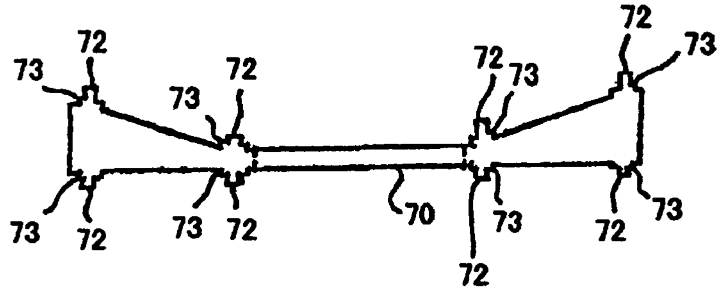
FIG. 23 is an unfolded view of spacer section in an eighth embodiment of the invention.
Figure 24:
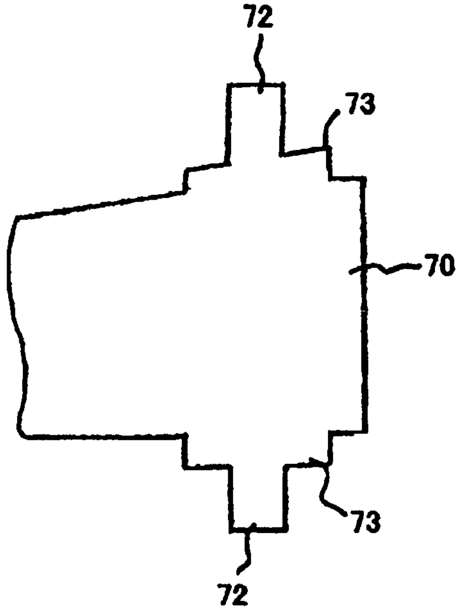
FIG. 24 is an enlarged plan view of the substrate supporting section of the spacer section in the eighth embodiment of the invention.

As shown in FIGS. 23 and 24, in the eighth embodiment, a spacer section 70 has auxiliary supporting sections 73 at base portions of substrate supporting sections 72. Other features are similar to those of the spacer section 60 in the seventh embodiment. The spacer section 60 in the seventh embodiment has more contact sections for contacting with the display unit substrate 2 or the operation unit substrate 3. Since the spacer section 60 is formed from a conductive material like a metal, if it contacts with the display unit substrate 2 or the operation unit substrate 3, the spacer section 60 and the circuit pattern may become short-circuited and cause a problem in a circuit operation. To avoid the problem, the circuit pattern should not be arranged where the spacer section 60 contacts with the display unit substrate 2 or with the operation unit substrate 3. Such restriction on the substrate layout may increase the size of the display unit substrate 2 or the operation unit substrate 3 in some cases.

Accordingly, in the eighth embodiment, the auxiliary supporting sections 73 are provided at the base portions 72 of the spacer section 70, so that the contacting portion of the spacer section 70 with the display unit substrate 2 or the operation unit substrate 3 is made smaller. The auxiliary supporting sections 73 are made slightly larger than the connection holes of the display unit substrate 2 and the operation unit substrate 3 to insert the substrate supporting sections 72, and are strong enough at least to support the display unit substrate 2 and the operation unit substrate 3.

According to the eighth embodiment of the invention, the auxiliary supporting sections 73 are provided at the base portions of the substrate supporting section 72 of the spacer section 70, and the contacting portion of the spacer section 70 with the display unit substrate 2 or the operation unit substrate 3 is made smaller. Accordingly, the restriction in arranging the display unit substrate 2 or the operation unit substrate 3 can be reduced, thereby reducing the size and the manufacturing cost of the display unit substrate 2 or the operation unit substrate 3.

Ninth Embodiment

Figure 25:
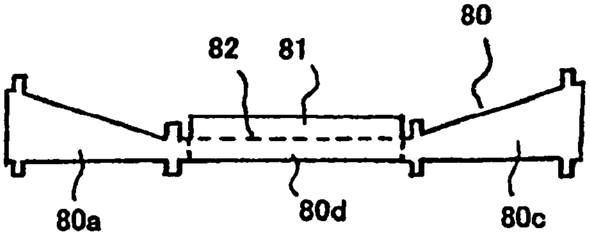
FIG. 25 is an unfolded view of a spacer section in a ninth embodiment of the invention.

As shown in FIG. 25, in a spacer section 80 of the ninth embodiment, a reinforcing section 81 is provided at a part of the spacer section 60 of the seventh embodiment. The reinforcing section 81 is provided at a side of a wall section 80*d*, where the display unit substrate 2 is attached, and can be bent along a hidden line 82 in FIG. 25. When the spacer section 80 is arranged between the display unit substrate 2 and the operation unit substrate 3, the reinforcing section 81 is bent to an area surrounded by wall sections 80*a*, 80*c*, and 80*d*. A procedure of attaching the spacer section in the ninth embodiment is similar to that in the seventh embodiment, and explanation thereof is omitted.

According to the ninth embodiment, the wall sections 80*a* and 80*c*, which have an oblique side of the spacer section 80, are connected with the wall section 80*d* having a lower height, and the reinforcing section 81 is provided at the wall section 80*d*. In addition to the effects in the seventh embodiment, such constitution enables the spacer section 80 to have enough strength to mount the display unit substrate 2 and the operation unit substrate 3.

Tenth Embodiment

As shown in FIG. 4, the operation unit substrate 3 has the LEDs 6 to inform the operator of the status of the electro-photographic printer, such as error or if it is ready for operation. Visually observing an emitting state of the LEDs 6 through the LED window 12 formed from a transparent material, the operator can recognize the condition of the electro-photographic printer. When a plurality of LEDs 6 is attached to the electro-photographic printer, light of one of the LEDs 6 may leak through the LED window 12 of another of the LEDs 6, so that the operator may not be able to correctly recognize information.

Figure 26:
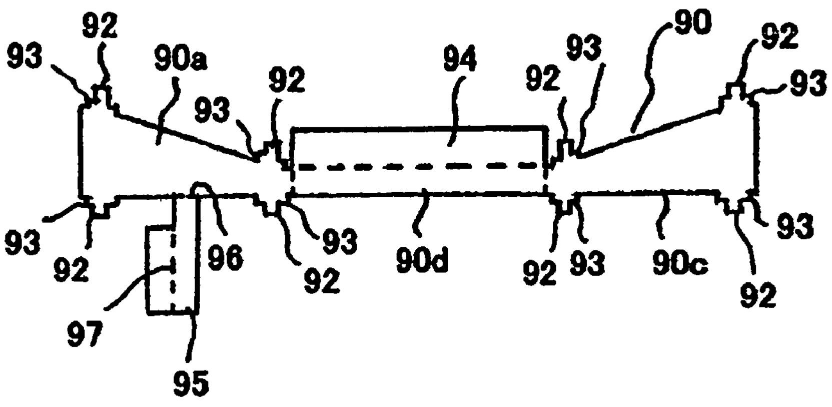
FIG. 26 is an unfolded view of a spacer section in a tenth embodiment of the invention.

As shown in FIG. 26, a spacer section 90 in the tenth embodiment has three wall sections 90*a*, 90*c*, and 90*d*, substrate supporting sections 92, auxiliary supporting sections 93, and a reinforcing section 94. In addition, the wall section 90*a* has a divider 95. The divider 95 can be bent along a hidden line 96 toward the spacer section 90, and also at a hidden line 97.

Figure 27:
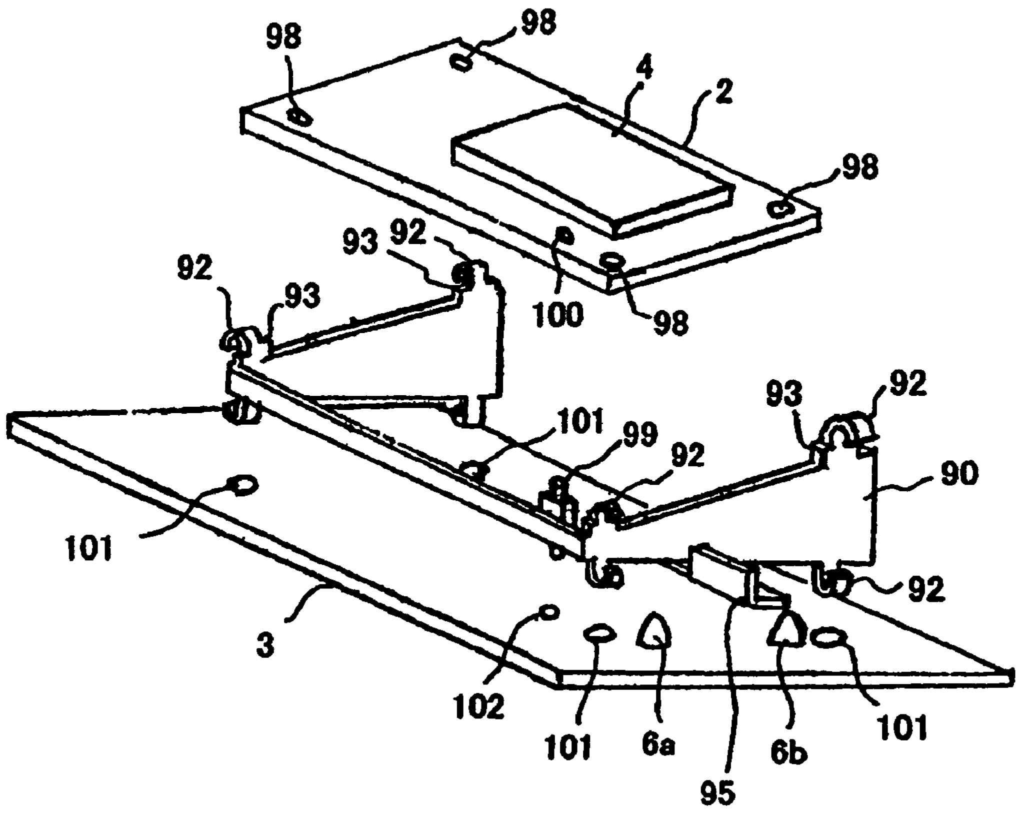
FIG. 27 is an exploded perspective view illustrating the spacer section in an attached state in the tenth embodiment of the invention.

As shown in FIG. 27, the display unit substrate 2 has connection holes 98 at positions corresponding to the substrate supporting sections 92, and a connection hole 100 at a position corresponding to a connection terminal 99. In addition, the operation unit substrate 3 has connection holes 101 at positions corresponding to the substrate supporting section 92, and a connection hole 102 at a position corresponding to the connection terminals 99. The operation unit substrate 3 has two LEDs 6*a* and 6*b* to inform the operator of the condition of the electro-photographic printer.

A procedure of attaching the spacer section in the tenth embodiment will be described below. First, the spacer section 90 is formed through bending a metal sheet having the shape illustrated in FIG. 26 at hidden lines. At this time, the divider 95 is also bent for about 90 degrees at the hidden lines 96 and 97. Then, the substrate supporting sections 92 of the spacer section 90 are inserted into the connection holes 98 of the display unit substrate 2, and the display unit substrate 2 is secured to the spacer section 90. Simultaneously, an upper end of the connection terminal 99 of the spacer section 90 is inserted into the connection hole 100 of the display unit substrate 2 and soldered. Accordingly, the display unit substrate 2 and the connection terminal 99 are electrically connected to each other.

Then, before mounting the spacer section 90, to which the display unit substrate 2 is mounted, on the operation unit substrate 3, necessary electronic components are mounted to the operation unit substrate 3. Then, the substrate supporting section 92, which protrudes downwardly relative to the spacer section 90, is inserted into the connection hole 101 of the operation unit substrate 3, so as to secure the operation unit substrate 3 to the spacer section 90. Simultaneously, the lower end of the connection terminal 99 of the spacer section 90 is inserted into the connection hole 102, and soldered. Accordingly, the operation unit substrate 3 and the connection terminal 99 are electrically connected to each other, and the display unit substrate 2 and the operation unit substrate 3 are electrically connected to each other via the connection terminal 99.

Figure 28:
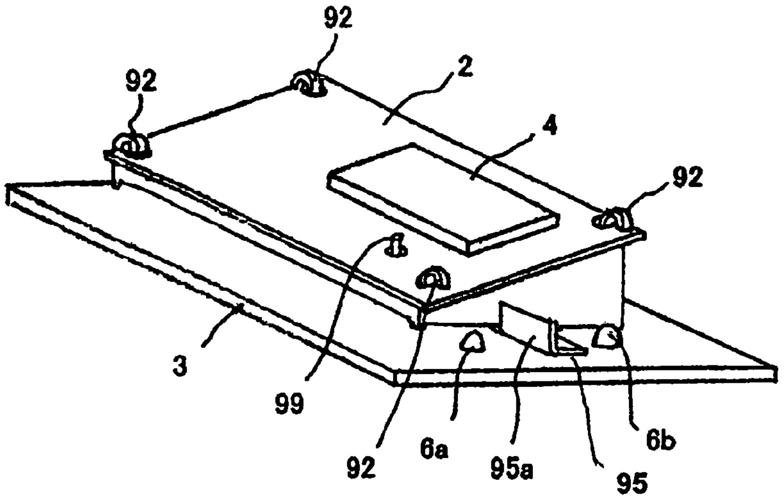
FIG. 28 is a perspective view illustrating the spacer section in the attached state in the tenth embodiment of the invention.

As shown in FIG. 28, the divider 95 provided at the spacer section 90 is arranged between the LED 6*a* and the LED 6*b*. The divider 95 has a bent-up section 95*a*, which is perpendicularly provided to the divider 95. With the bent-up section 95*a*, light leak from the LED 6*a* to the LED 6*b* or from the LED 6*b* to the LED 6*a* can be restricted. In the embodiment, the two light emitting elements (LEDs 6*a* and 6*b*) are provided as an example. In case that there are three light emitting elements, the spacer section 90 can have a plurality of dividers 95.

Figure 29:
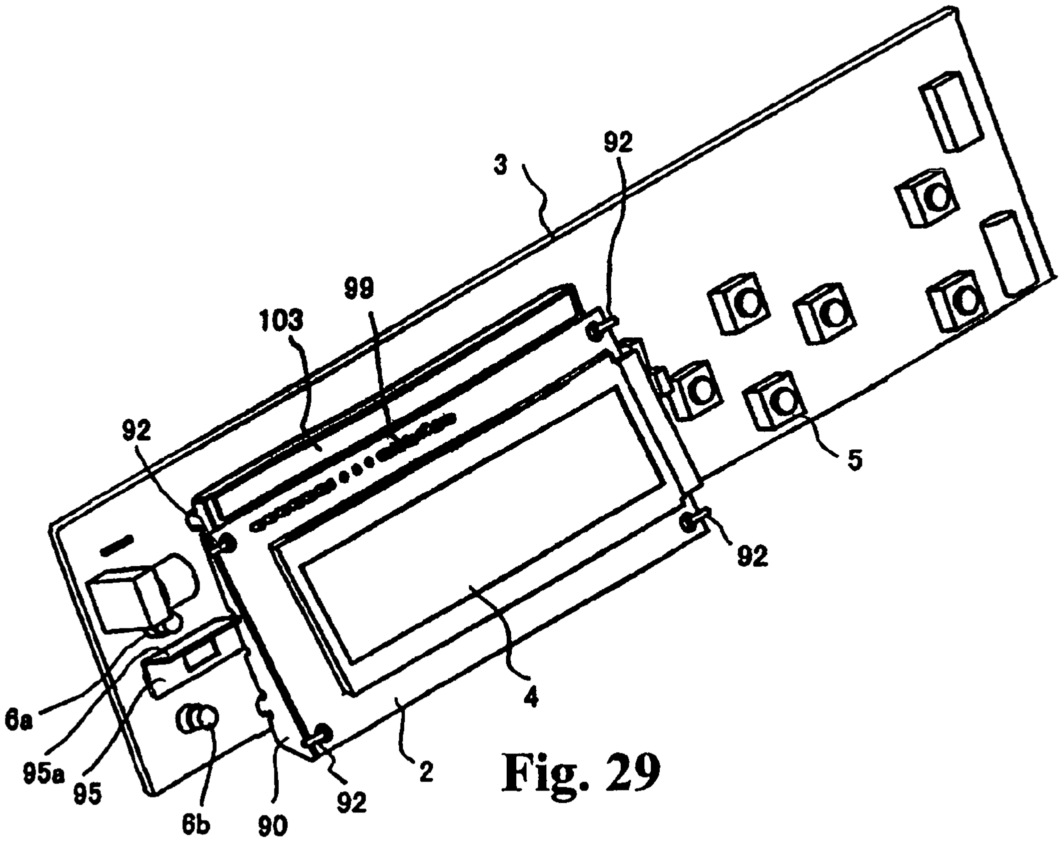
FIG. 29 is a perspective view of the display panel structure in the tenth embodiment of the invention.

As shown in FIG. 29, the operation unit substrate 3 is provided with operation buttons 5 in addition to the LEDs 6*a* and 6*b*. The spacer section 90 is provided with a reinforcing portion 103 and a plurality of the connection terminals 99.

According to the tenth embodiment, the divider for shielding light from the light emitting element is integrated with the spacer section 90. With this constitution, the recognition errors by the operator can be reduced. In addition, since the spacer section 90 and the divider 95 are mounted at the same time, the work of mounting the spacer section 95 can be simplified. Furthermore, by integrating the divider 95 with the spacer section 90 from a metal sheet, the manufacturing cost can be reduced.

Each embodiment described above is not intended to limit the present invention. It should be noted that the invention can be altered or modified based on the scope of the invention, and such variations fall within the sprit and the scope of the invention. For example, the upper end and the lower end of the substrate supporting section can be respectively bent at any bending direction into a curved shape if necessary. In addition, the reinforcing section can be formed to the spacer section at any position if necessary. Moreover, the auxiliary supporting section at the base portion of the substrate supporting section can be formed to the spacer section if necessary.

The disclosure of Japanese Patent Application No. 2004-313501, filed on Oct. 28, 2004, is incorporated in the application.

While the invention has been explained with reference to the specific embodiments of the invention, the explanation is illustrative and the invention is limited only by the appended claims.

What is claimed is:

1. A display panel structure, comprising:

a circuit board:

a display unit substrate having a display unit; and a supporting portion for supporting the display unit substrate in a state inclined relative to the circuit board, said supporting portion being formed of a sheet member curved in a frame shape, said supporting portion including a first supporting section for engaging the circuit board, a second supporting section for engaging the display unit substrate, and a spacer section disposed between the first supporting section and the second supporting section for securing a specific space between the circuit board and the display unit substrate, said spacer section including a connection terminal for electrically connecting the circuit board to the display unit substrate, said connector terminal being attached to the circuit board and the display unit substrate, said spacer section further including a first wall portion having a constant width, a second wall portion extending from one end portion of the first wall portion and having variable width, and a third wall portion extending from the other end portion of the first wall portion and having a variable width, said first supporting section and said second supporting section integrally extending from the first wall portion and the second wall portion, respectively.

2. The display panel structure according to claim 1, wherein said supporting portion includes a plurality of supporting members having different lengths for supporting the display unit substrate.

3. The display panel structure according to claim 1, wherein said first supporting section is fitted in a first hole formed in the circuit board while being elastically deformed, and engages with the circuit board by recovering from the elastic deformation after passing the first hole, and said second supporting section is fitted in a second hole formed in the display unit substrate while being elastically deformed, and engages with the display unit substrate by recovering from the elastic deformation after passing the second hole.

4. The display panel structure according to claim 1, wherein said supporting portion is arranged to electrically connect the circuit board and the display unit substrate.

5. The display panel structure according to claim 1, wherein said spacer section has a rectangular shape formed of at least three wall sections including a pair of wall sections with a height continuously varying.

6. The display panel structure according to claim 5, wherein said spacer section is formed of a plastic material.

7. The display panel structure according to claim 5, wherein said spacer section is formed of a metallic material.

8. The display panel structure according to claim 5, wherein said supporting portion is formed of a bent sheet member.

9. The display panel structure according to claim 5, wherein at least one of said wall sections includes a reinforcing section.

10. The display panel structure according to claim 5, wherein said spacer section includes a wall section having a constant height and connecting lower edges of the pair of the wall sections.

11. The display panel structure according to claim 5, further comprising an auxiliary supporting section disposed at a base portion of each of the first supporting section and the second supporting section, respectively.

12. The display panel structure according to claim 5, wherein at least one of said wall sections includes a divider for shielding light from a light emitting element to be mounted on the circuit board.

13. The display panel structure according to claim 1, wherein said circuit board includes an operation unit substrate having an operation unit.

14. An image forming apparatus having the display panel structure according to claim 1.

* * * * *